United States Patent
Sriraman et al.

(10) Patent No.: US 10,249,511 B2
(45) Date of Patent: Apr. 2, 2019

(54) CERAMIC SHOWERHEAD INCLUDING CENTRAL GAS INJECTOR FOR TUNABLE CONVECTIVE-DIFFUSIVE GAS FLOW IN SEMICONDUCTOR SUBSTRATE PROCESSING APPARATUS

(71) Applicant: Lam Research Corporation, Fremont, CA (US)

(72) Inventors: Saravanapriyan Sriraman, Fremont, CA (US); Alexander Paterson, San Jose, CA (US)

(73) Assignee: LAM RESEARCH CORPORATION, Fremont, CA (US)

( * ) Notice: Subject to any disclaimer, the term of this patent is extended or adjusted under 35 U.S.C. 154(b) by 0 days.

(21) Appl. No.: 14/317,084

(22) Filed: Jun. 27, 2014

(65) Prior Publication Data
US 2015/0380281 A1    Dec. 31, 2015

(51) Int. Cl.
*C23C 16/455* (2006.01)
*H01J 37/32* (2006.01)
*H01L 21/3213* (2006.01)

(52) U.S. Cl.
CPC .. *H01L 21/32136* (2013.01); *C23C 16/45559* (2013.01); *C23C 16/45565* (2013.01);
(Continued)

(58) Field of Classification Search
CPC .... C23C 16/45502–16/4551; C23C 16/45517; C23C 16/45561;
(Continued)

(56) References Cited

U.S. PATENT DOCUMENTS 5,062,386 A * 11/1991 Christensen ........ C23C 16/4411
118/715
5,544,524 A * 8/1996 Huyer ..................... B64C 21/00
73/147
(Continued)

FOREIGN PATENT DOCUMENTS

CN          1639831 A       7/2005
TW        200849344 A      12/2008
(Continued)

OTHER PUBLICATIONS

"Sealing Elements: Technical Handbook O-rings." pp. 1-21, 47-59, 93, & 131-161. Apr. 2013. Source location: Eriks N.V., http://eriks.info/en/home/. Available: http://o-ring.info/en/downloads/technical-handbook/. Accessed: Dec. 18, 2015.*
(Continued)

*Primary Examiner* — Parviz Hassanzadeh
*Assistant Examiner* — Stanislav Antolin

(57) ABSTRACT

An inductively coupled plasma processing apparatus comprises a vacuum chamber, a vacuum source, and a substrate support on which a semiconductor substrate is supported. A ceramic showerhead forms an upper wall of the vacuum chamber. The ceramic showerhead includes a gas plenum in fluid communication with a plurality of showerhead gas outlets for supplying process gas to the interior of the vacuum chamber, and a central opening configured to receive a central gas injector. A central gas injector is disposed in the central opening of the ceramic showerhead. The central gas injector includes a plurality of gas injector outlets for supplying process gas to the interior of the vacuum chamber. An RF energy source energizes the process gas into a plasma state to process the semiconductor substrate. The flow rate of the process gas supplied by the central gas injector and the flow rate of the process gas
(Continued)

supplied by the ceramic showerhead can be independently controlled.

8 Claims, 4 Drawing Sheets

(52) U.S. Cl.
CPC ...... *C23C 16/45574* (2013.01); *H01J 37/321* (2013.01); *H01J 37/3244* (2013.01); *H01J 37/32119* (2013.01)

(58) Field of Classification Search
CPC .... C23C 16/45563–16/4558; C23C 16/45565; C23C 16/45574; C23C 16/45587–16/45589; C23C 16/517; C23C 16/52; C23C 16/45559; C30B 25/14; H01J 37/3209; H01J 37/321–37/32219; H01J 37/3244–37/32449; H01J 37/32467; H01J 37/32513; H01J 37/32119; H01L 21/3065; H01L 21/31116; H01L 21/31138; H01L 21/32136; H01L 21/67063–21/67069; Y10S 438/935
See application file for complete search history.

(56) References Cited

U.S. PATENT DOCUMENTS

| | | | | |
|---|---|---|---|---|
| 5,600,060 | A * | 2/1997 | Grant | G01M 9/08 73/147 |
| 5,820,723 | A * | 10/1998 | Benjamin | H01J 37/16 118/723 E |
| 5,948,704 | A * | 9/1999 | Benjamin | H01J 37/20 118/723 R |
| 6,013,155 | A * | 1/2000 | McMillin | C23C 16/455 118/723 I |
| 6,059,885 | A * | 5/2000 | Ohashi | C23C 16/4401 118/715 |
| 6,183,565 | B1 * | 2/2001 | Granneman | C23C 16/45521 118/724 |
| 6,251,793 | B1 * | 6/2001 | Wicker | H01J 37/321 216/67 |
| 6,294,026 | B1 * | 9/2001 | Roithner | C23C 16/455 118/715 |
| 6,333,272 | B1 | 12/2001 | McMillin et al. | |
| 6,424,923 | B1 * | 7/2002 | Huyer | G01M 9/06 137/804 |
| 6,471,779 | B1 * | 10/2002 | Nishio | C23C 16/455 118/715 |
| 6,506,254 | B1 * | 1/2003 | Bosch | H01J 37/32477 118/715 |
| 6,676,760 | B2 | 1/2004 | Kholodenko et al. | |
| 6,736,931 | B2 | 5/2004 | Collins et al. | |
| 6,770,851 | B2 * | 8/2004 | Granneman | H01L 21/6838 118/50.1 |
| 7,655,111 | B2 | 2/2010 | Horiguchi | |
| 8,025,731 | B2 * | 9/2011 | Ni | H01J 37/3244 118/715 |
| 8,075,690 | B2 | 12/2011 | Keller et al. | |
| 8,343,876 | B2 | 1/2013 | Sadjadi et al. | |
| 8,440,473 | B2 | 5/2013 | Xu et al. | |
| 8,562,785 | B2 | 10/2013 | Kang et al. | |
| 8,673,785 | B2 * | 3/2014 | Huang | C23C 16/45561 216/37 |
| 9,051,647 | B2 * | 6/2015 | Cooperberg | C23C 16/45574 |
| 2001/0010257 | A1 * | 8/2001 | Ni | H01J 37/3244 156/345.33 |
| 2001/0054377 | A1 * | 12/2001 | Lindfors | C23C 16/4402 117/104 |
| 2002/0075625 | A1 * | 6/2002 | Sexton | H01L 21/6831 361/234 |
| 2002/0092584 | A1 * | 7/2002 | Soininen | H01L 21/321 148/282 |
| 2003/0041801 | A1 * | 3/2003 | Hehmann | C23C 14/14 118/715 |
| 2003/0070620 | A1 * | 4/2003 | Cooperberg | C23C 16/45574 118/723 AN |
| 2003/0092231 | A1 * | 5/2003 | Granneman | H01L 21/67109 438/200 |
| 2003/0168427 | A1 * | 9/2003 | Flamm | H01J 37/321 216/2 |
| 2004/0087168 | A1 * | 5/2004 | Granneman | C23C 16/45521 438/706 |
| 2004/0124280 | A1 * | 7/2004 | Shih | H01J 37/3244 239/548 |
| 2004/0142558 | A1 * | 7/2004 | Granneman | C23C 16/4411 438/680 |
| 2004/0187779 | A1 * | 9/2004 | Park | C23C 16/4404 118/715 |
| 2005/0098553 | A1 * | 5/2005 | Devine | F27B 17/0025 219/411 |
| 2005/0181617 | A1 * | 8/2005 | Bosch | C04B 41/0054 438/710 |
| 2005/0187094 | A1 * | 8/2005 | Hayashi | C04B 35/111 501/127 |
| 2007/0042603 | A1 * | 2/2007 | Kropewnicki | H01L 21/32137 438/689 |
| 2007/0079936 | A1 * | 4/2007 | Li | C04B 35/63452 156/345.48 |
| 2007/0144671 | A1 * | 6/2007 | Ohmi | C23C 16/45565 156/345.34 |
| 2007/0187363 | A1 * | 8/2007 | Oka | H01J 37/3244 216/59 |
| 2007/0247075 | A1 | 10/2007 | Kim et al. | |
| 2008/0072821 | A1 * | 3/2008 | Dalton | C03B 25/14 118/715 |
| 2008/0173735 | A1 * | 7/2008 | Mitrovic | C23C 16/45565 239/548 |
| 2009/0022149 | A1 | 1/2009 | Rosenberg et al. | |
| 2009/0042321 | A1 * | 2/2009 | Sasaki | H01J 37/32449 438/10 |
| 2009/0107403 | A1 * | 4/2009 | Moshtagh | C23C 16/4584 118/728 |
| 2009/0142247 | A1 * | 6/2009 | Sun | C04B 41/009 423/345 |
| 2009/0159424 | A1 * | 6/2009 | Liu | H01J 37/32449 204/164 |
| 2009/0159566 | A1 * | 6/2009 | Brillhart | C23C 16/4586 216/58 |
| 2009/0169744 | A1 * | 7/2009 | Byun | C23C 16/40 427/255.28 |
| 2009/0221149 | A1 | 9/2009 | Hammond, IV et al. | |
| 2009/0275206 | A1 * | 11/2009 | Katz | H01J 37/3244 438/714 |
| 2009/0311869 | A1 * | 12/2009 | Okesaku | H01J 37/3244 438/710 |
| 2010/0041238 | A1 * | 2/2010 | Cooperberg | C23C 16/45574 438/710 |
| 2010/0047450 | A1 * | 2/2010 | Li | C23C 16/4412 427/255.28 |
| 2010/0089870 | A1 * | 4/2010 | Hiroshima | C23C 16/45574 216/68 |
| 2010/0166955 | A1 * | 7/2010 | Becker | C23C 16/4401 427/248.1 |
| 2010/0263588 | A1 * | 10/2010 | Zhiyin | C23C 16/45508 117/98 |
| 2010/0288439 | A1 * | 11/2010 | Ishibashi | C23C 16/45565 156/345.33 |
| 2011/0023775 | A1 * | 2/2011 | Nunes | C23C 16/45551 118/58 |
| 2011/0045196 | A1 * | 2/2011 | Forrest | C23C 14/12 427/427.4 |
| 2011/0076401 | A1 * | 3/2011 | Chao | C23C 16/325 427/249.16 |
| 2011/0088623 | A1 * | 4/2011 | Mitrovic | C23C 16/45565 118/730 |
| 2011/0091648 | A1 * | 4/2011 | Mitrovic | C23C 16/45565 427/255.23 |

(56) References Cited

U.S. PATENT DOCUMENTS

| | | | | |
|---|---|---|---|---|
| 2011/0114261 A1* | 5/2011 | Matsumoto | H01J 37/32192 | 156/345.33 |
| 2011/0291568 A1* | 12/2011 | Iizuka | H01J 37/321 | 315/111.51 |
| 2012/0129296 A1* | 5/2012 | Rolin | C23C 16/45565 | 438/99 |
| 2012/0156880 A1 | 6/2012 | Panagopoulos | | |
| 2012/0190208 A1* | 7/2012 | Ozu | H01J 37/3244 | 438/710 |
| 2012/0199952 A1* | 8/2012 | D'Evelyn | H01L 21/0237 | 257/615 |
| 2012/0266819 A1 | 10/2012 | Sanchez et al. | | |
| 2012/0305190 A1* | 12/2012 | Kang | H01J 37/321 | 156/345.34 |
| 2013/0098554 A1* | 4/2013 | Chhatre | H01J 37/32119 | 156/345.27 |
| 2013/0109159 A1* | 5/2013 | Carlson | C23C 16/45565 | 438/503 |
| 2013/0126486 A1* | 5/2013 | Bise | H01J 37/3244 | 219/121.48 |
| 2014/0150713 A1* | 6/2014 | Coe | C23C 16/274 | 117/88 |
| 2014/0224177 A1* | 8/2014 | Park | H01J 37/3244 | 118/730 |
| 2014/0302678 A1* | 10/2014 | Paterson | H01L 21/3065 | 438/700 |
| 2014/0302680 A1* | 10/2014 | Singh | H01L 21/3065 | 438/710 |
| 2014/0302681 A1* | 10/2014 | Paterson | H01L 21/3065 | 438/710 |
| 2015/0235811 A1* | 8/2015 | Cooperberg | H01J 37/32449 | 438/719 |
| 2016/0293431 A1* | 10/2016 | Sriraman | H01L 21/3065 | |

FOREIGN PATENT DOCUMENTS

| | | | | |
|---|---|---|---|---|
| WO | WO-2012084656 A1 * | 6/2012 | | C01B 31/06 |
| WO | WO-2012176996 A2 * | 12/2012 | | H01J 37/3244 |

OTHER PUBLICATIONS

Ideen Sadrehaghighi. "Elements of Fluid Dynamics—A Review." pp. 1-96. May 2015. 10.13140/RG.2.2.31647.46249. (Year: 2015).*

Convection-diffusion equation. (no date {n.d.}). In Wikipedia. Retrieved Jun. 19, 2018, from https://en.wikipedia.org/w/index.php?title=Convection-diffusion_equation&oldid=836376883. pp. 1-10. (Year: 2018).*

Notification of Office Action dated Feb. 2, 2018 corresponding to Chinese Patent Application No. 201510372711.6, 10 pages.

* cited by examiner

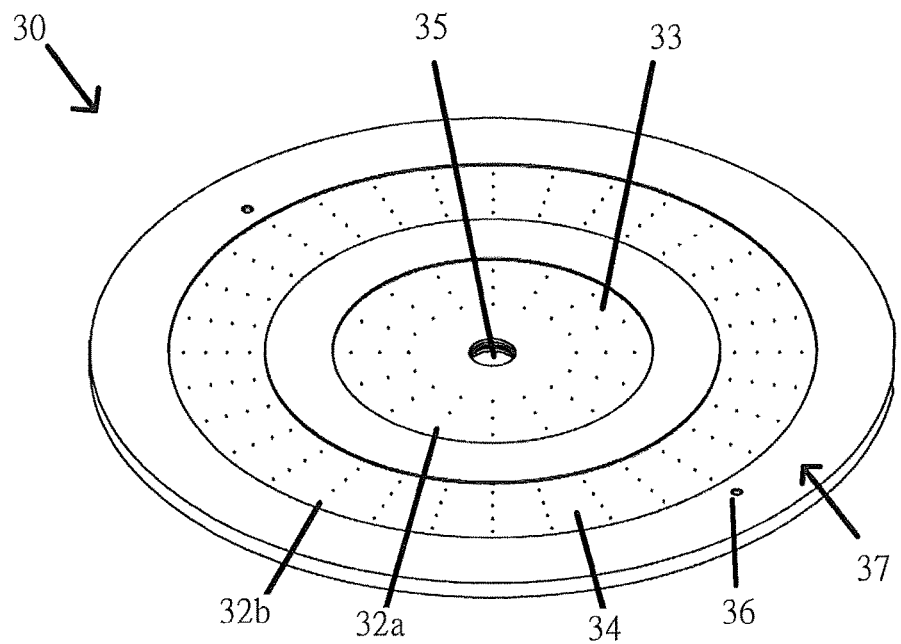
FIG. 3A
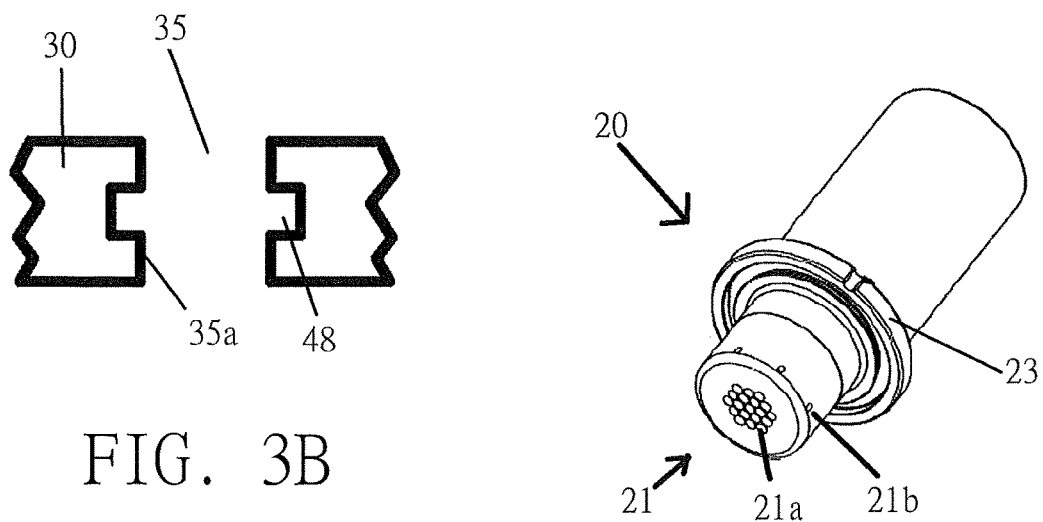
FIG. 3B
FIG. 4

CERAMIC SHOWERHEAD INCLUDING CENTRAL GAS INJECTOR FOR TUNABLE CONVECTIVE-DIFFUSIVE GAS FLOW IN SEMICONDUCTOR SUBSTRATE PROCESSING APPARATUS

FIELD OF THE INVENTION

The invention relates to semiconductor substrate processing apparatuses and more specifically to a ceramic showerhead including a central gas injector for tunable process gas delivery to a vacuum chamber of the semiconductor substrate processing apparatus.

BACKGROUND

Semiconductor structures are formed in semiconductor substrates in semiconductor substrate processing apparatus by techniques including, but not limited to, plasma etching, physical vapor deposition (PVD), chemical vapor deposition (CVD), plasma-enhanced chemical vapor deposition (PECVD), atomic layer deposition (ALD), plasma-enhanced atomic layer deposition (PEALD), atomic layer etch (ALE), plasma-enhanced atomic layer etch (PE-ALE), ion implantation, or resist removal. Semiconductor structures can be processed in plasma processing apparatuses including a plasma processing chamber (i.e. vacuum chamber), a gas source that supplies process gas into the chamber, and an energy source that produces plasma from the process gas. Different process gases are used for these processing techniques, as well as the processing of different materials of semiconductor structures.

SUMMARY

Disclosed herein is an inductively coupled plasma processing apparatus. The apparatus comprises a vacuum chamber, a vacuum source adapted to exhaust process gas and byproducts of the plasma processing from the vacuum chamber, and a substrate support on which a semiconductor substrate is supported in an interior of the vacuum chamber. A ceramic showerhead forms an upper wall of the vacuum chamber wherein the ceramic showerhead includes a gas plenum in fluid communication with a plurality of showerhead gas outlets in a plasma exposed surface thereof for supplying process gas to the interior of the vacuum chamber, and a central opening configured to receive a central gas injector. A central gas injector is disposed in the central opening of the ceramic showerhead wherein the central gas injector includes a plurality of gas injector outlets for supplying process gas to the interior of the vacuum chamber. An RF energy source which inductively couples RF energy through the ceramic showerhead and into the vacuum chamber energizes the process gas into a plasma state to process the semiconductor substrate. The flow rate of the process gas supplied by the central gas injector and the flow rate of the process gas supplied by the ceramic showerhead can be independently controlled.

Further disclosed herein is a ceramic showerhead of an inductively coupled plasma processing apparatus. The ceramic showerhead forms an upper wall of a vacuum chamber of the plasma processing apparatus. The ceramic showerhead comprises a gas plenum in fluid communication with a plurality of showerhead gas outlets in a plasma exposed surface thereof for supplying process gas to an interior of the vacuum chamber, and a central opening configured to receive a central gas injector. The ceramic showerhead is operable to control a flow rate of the process gas supplied therethrough independently of a flow rate of process gas configured to be supplied through the central gas injector.

Also disclosed herein is a method of plasma processing a semiconductor substrate in an inductively coupled plasma processing apparatus. The method comprises placing a semiconductor substrate on a substrate support in a vacuum chamber, wherein a plasma exposed surface of a ceramic showerhead including a central gas injector forms a wall of the vacuum chamber which faces the substrate support. Process gas is supplied into the vacuum chamber from gas injector outlets of the central gas injector and/or the showerhead gas outlets of the ceramic showerhead. The flow rates of the process gas supplied by the ceramic showerhead and the central gas injector are controlled independently of each other. The process gas is energized into a plasma state by inductively coupling RF energy produced by the RF energy source through the ceramic showerhead into the vacuum chamber, wherein the process gas is plasma phase reacted with an exposed surface of the semiconductor substrate to thereby process the semiconductor substrate.

BRIEF DESCRIPTION OF THE DRAWING FIGURES

FIG. 3A illustrates an embodiment of a ceramic showerhead which can include a central gas injector, and FIG. 3B illustrates a cross section of a central portion of the ceramic showerhead in accordance with embodiments as disclosed herein.

FIG. 4 illustrates an embodiment of a central gas injector which can be disposed in a ceramic showerhead in accordance with embodiments disclosed herein.

DETAILED DESCRIPTION

Figure 1:
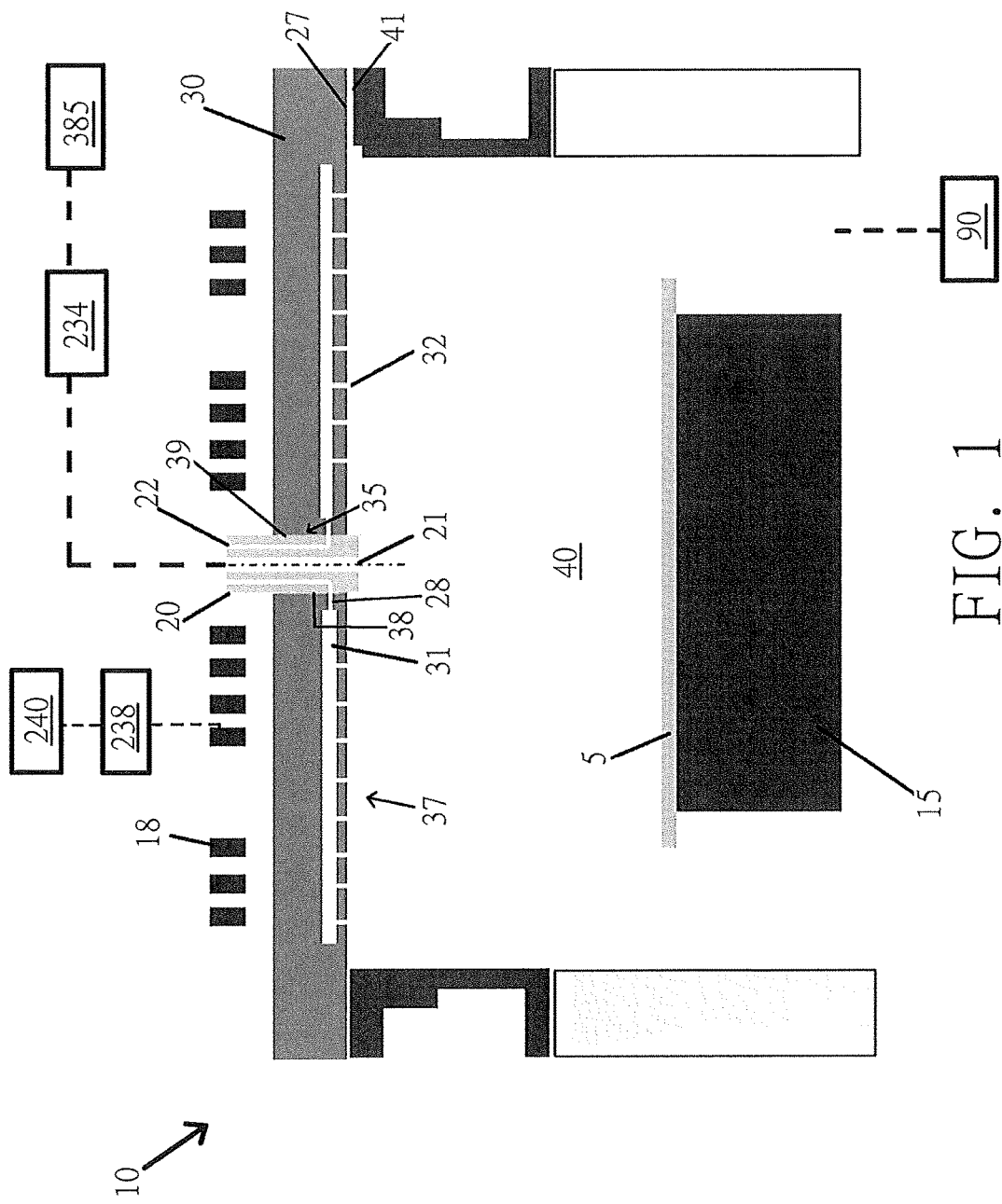
FIG. 1 illustrates an embodiment of a semiconductor substrate plasma processing apparatus in accordance with embodiments as disclosed herein.

Disclosed herein is a ceramic showerhead including a central gas injector of a semiconductor substrate processing apparatus wherein the ceramic showerhead including the central gas injector is operable to provide a tunable convective-diffusive process gas flow into a vacuum chamber of a semiconductor substrate processing apparatus. The semiconductor substrate processing apparatus can be used for processing semiconductor substrates by techniques including, but not limited to, plasma etching, physical vapor deposition (PVD), chemical vapor deposition (CVD), plasma-enhanced chemical vapor deposition (PECVD), atomic layer deposition (ALD), plasma-enhanced atomic layer deposition (PEALD), atomic layer etch (ALE), plasma-enhanced atomic layer etch (PE-ALE), ion implantation, or resist removal. Preferably, the semiconductor substrate processing apparatus is an inductively coupled plasma processing apparatus. In the following description, numerous specific details are set forth in order to provide a thorough understanding of the present embodiments. It will be apparent, however, to one skilled in the art that the present embodiments may be practiced without some or all of these specific details. In other instances, well known process operations have not been described in detail in order not to unnecessarily obscure present embodiments disclosed herein.

As used herein, a tunable convective-diffusive process gas flow refers to the ability of the ceramic showerhead including the central gas injector to provide a convective gas flow, a diffusive gas flow, or simultaneously a convective gas flow and a diffusive gas flow to an upper surface of a semiconductor substrate supported on a substrate support of the vacuum chamber. In an embodiment the ceramic showerhead can be a multizone showerhead wherein the flow rate of process gas delivered through each respective zone of the showerhead can be controlled. In an embodiment the central gas injector can be a multizone gas injector wherein the flow rate of the process gas delivered through each respective zone of the gas injector can be controlled. Additionally, as used herein, the term "about" when used with reference to numerical values refers to ±10%.

An exemplary embodiment of a multizone showerhead can be found in commonly-assigned U.S. Application No. 2013/0126486 which is incorporated by reference herein in its entirety. An exemplary embodiment of a multizone gas injector can be found in commonly-assigned U.S. Application No. 2010/0041238 which is incorporated by reference herein in its entirety.

In semiconductor substrate processing, the method of injecting process gases into a vacuum chamber and the pressure of the vacuum chamber can affect the distribution of chemically reactive species above the surface of a semiconductor substrate and thus uniformity of the overall processing of the semiconductor substrate due to redeposition of semiconductor substrate etch by-products on regions of an upper surface thereof. To control redeposition of substrate by-products, the flow of process gas supplied by the ceramic showerhead including the central gas injector to the interior of the vacuum chamber can preferably be switched between a diffusive gas flow and a convective gas flow, or a convective and diffusive gas flow, while the pressure in the vacuum chamber during processing is variably controlled. Changes in flow rate of the process gas and/or pressure within the vacuum chamber can affect the redeposition of by-product on the upper surface. For example, when a gas injector supplies a convective gas flow at about 10 mT, the by-product redeposition profile is relatively uniform and lean from center to edge of the semiconductor substrate, whereas for the same flow at a pressure of about 100 mT, the radial non-uniformity in by-product redeposition is increased. To reduce redeposition of by-product, preferably the pressure and flow rate of process gas supplied by the apparatus are controlled (i.e. tuned) such that eddy currents are not formed above the upper surface of the semiconductor substrate being processed. In this manner, the residence time of by-products in the vacuum chamber is reduced.

In an embodiment, a dual-mode ceramic showerhead includes a central gas injector for injecting process gas into a semiconductor substrate processing apparatus wherein the dual-mode ceramic showerhead is operable to provide a tunable convective-diffusive process gas flow into a vacuum chamber of a semiconductor substrate processing apparatus, such that radial by-product redeposition of etched material can be controlled for varying pressures in the vacuum chamber and for varying gas flows supplied to an interior of the vacuum chamber. Preferably, the semiconductor substrate processing apparatus is an inductively coupled plasma processing apparatus. The inductively coupled plasma processing apparatus includes a vacuum chamber, and a substrate support on which a semiconductor substrate can be supported and plasma processed within the vacuum chamber. The ceramic showerhead forms an upper wall of the vacuum chamber wherein the ceramic showerhead includes a gas plenum in fluid communication with a plurality of showerhead gas outlets in a plasma exposed surface thereof such that process gas can be supplied to an interior of the vacuum chamber thereby. Preferably, the plurality of showerhead gas outlets are configured to supply a diffusive process gas flow to the interior of the vacuum chamber.

The ceramic showerhead preferably includes a central opening which is configured to receive a central gas injector. The central gas injector can be vacuum sealed in the central opening of the ceramic showerhead. The central gas injector includes a plurality of gas injector outlets for supplying process gas to an interior of the vacuum chamber. The plurality of gas injector outlets are configured to supply diffusive process gas flow, convective process gas flow, or diffusive and convective process gas flow to the interior of the vacuum chamber during semiconductor substrate processing. The inductively coupled plasma processing apparatus includes an RF energy source which inductively couples RF energy through the ceramic showerhead and into the vacuum chamber to energize the process gas into a plasma state to process the semiconductor substrate. The flow rate of the process gas supplied by the central gas injector and the flow rate of the process gas supplied by the ceramic showerhead can preferably be independently controlled.

Figure 2:
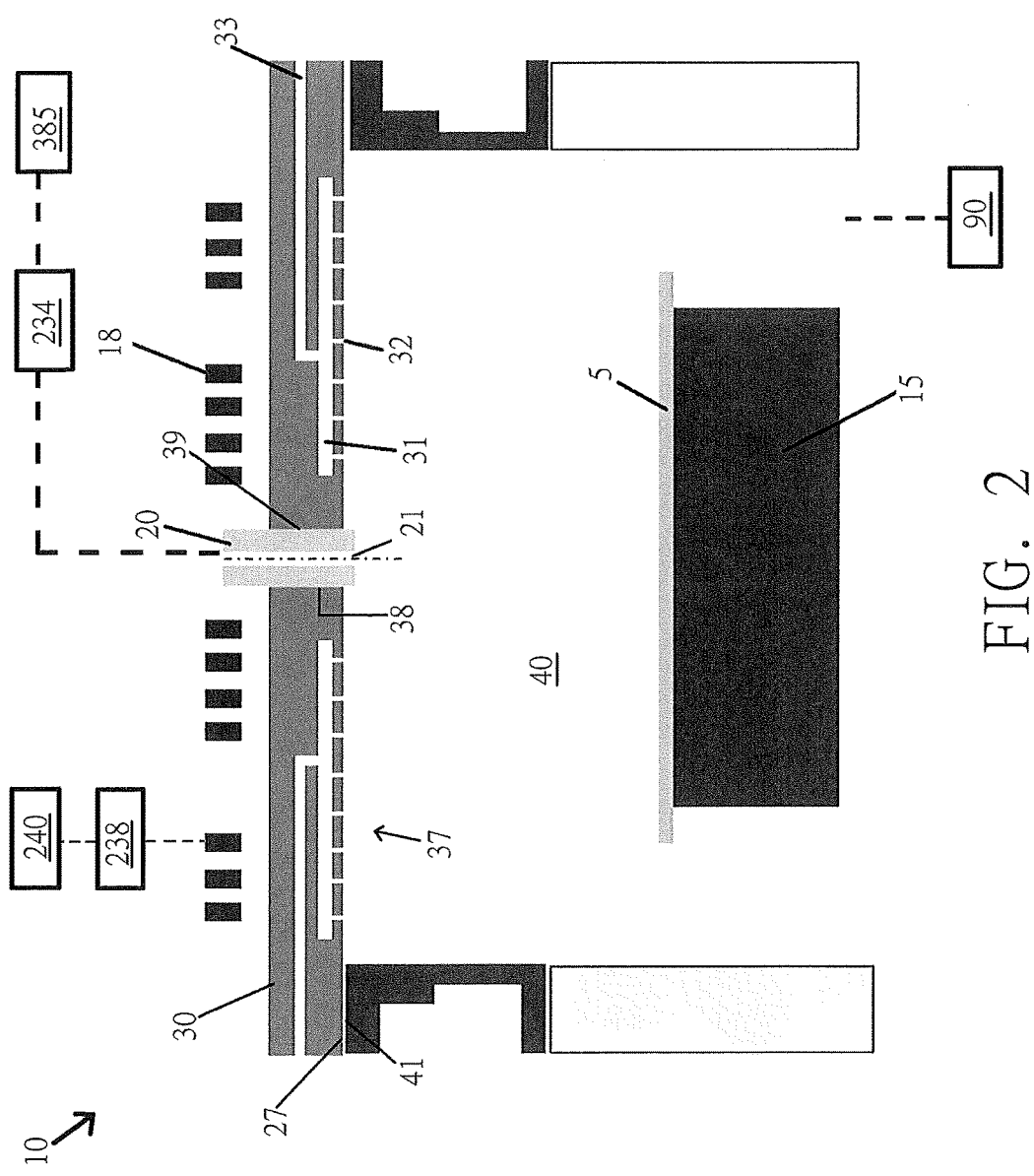
FIG. 2 illustrates an embodiment of a semiconductor substrate plasma processing apparatus in accordance with embodiments as disclosed herein.

FIGS. 1 and 2 illustrate embodiments of a semiconductor substrate processing apparatus which can include a ceramic showerhead 30 including a central gas injector 20 as disclosed herein. As shown in FIGS. 1 and 2, an inductively coupled plasma processing apparatus 10 can include a vacuum chamber 40 (i.e. plasma etch chamber). The vacuum chamber 40 includes a substrate support (lower electrode assembly) 15 for supporting a semiconductor substrate 5 in the interior of the vacuum chamber 40. The ceramic showerhead 30 including the central gas injector 20 forms an upper wall of vacuum chamber 40. Preferably, the ceramic showerhead 30 includes a lower vacuum sealing surface 27 which surrounds a plasma exposed surface 37 thereof and forms a vacuum seal with a vacuum sealing surface 41 of the vacuum chamber 40.

Process gases can be injected to the interior of the vacuum chamber 40 through the gas injector 20 alone, through the ceramic showerhead 30 alone, or through both the gas injector 20 and the ceramic showerhead 30. The flow rate of the process gas supplied by the central gas injector 20 and the flow rate of the process gas supplied by the ceramic showerhead 30 to the interior of the vacuum chamber 40 are preferably independently controlled. Further, the flow of process gas supplied by the ceramic showerhead 30 including the central gas injector 20 to the interior of the vacuum chamber can preferably be alternated between a diffusive gas flow and a convective gas flow, or a convective and diffusive gas flow can be supplied simultaneously. A gas delivery system 234 is preferably configured to control parameters of process gas supplied to the interior of the vacuum chamber 40 through the gas injector 20 and/or the ceramic showerhead 30. Parameters (e.g., temperature, flow rate, and chemical makeup) of the process gases supplied to the interior of the vacuum chamber by the gas delivery system 234 are preferably controlled by a control system 385. An exemplary embodiment of a gas delivery system having fast gas switching capabilities can be found in commonly-assigned U.S. Pat. No. 8,673,785 which is incorporated by reference herein in its entirety. Preferably, the pressure in the vacuum chamber 40 during processing can be variably controlled by a vacuum source 90 wherein the control system 385 preferably controls the vacuum source 90.

Once process gases are introduced into the interior of vacuum chamber 40, they are energized into a plasma state by an RF source such as an antenna 18 supplying energy into the interior of vacuum chamber 40. Preferably, the antenna 18 is an external planar antenna powered by a RF power source 240 and RF impedance matching circuitry 238 to inductively couple RF energy into vacuum chamber 40. However, in an alternate embodiment, the antenna 18 may be an external or embedded antenna which is nonplanar. An electromagnetic field generated by the application of RF power to planar antenna energizes the process gas in the interior of the vacuum chamber 40 to form high-density plasma (e.g., $10^9$-$10^{12}$ ions/cm$^3$) above substrate 5. During an etching process, the antenna 18 (i.e. a RF coil) performs a function analogous to that of a primary coil in a transformer, while the plasma generated in the vacuum chamber 40 performs a function analogous to that of a secondary coil in the transformer.

The ceramic showerhead 30 includes a plurality of showerhead gas outlets 32 in the plasma exposed surface 37 thereof for supplying process gas to the interior of the vacuum chamber 40. Preferably the central gas injector 20 is removably mounted in a central opening 35 of the ceramic showerhead 30 wherein a vacuum sealing surface 38 of the central gas injector 20 forms a vacuum seal with a central vacuum sealing surface 39 of the ceramic showerhead 30. In an embodiment the central gas injector 20 can include a flange which forms a vacuum seal of a stepped bore of the ceramic showerhead 30. The central gas injector 20 includes one or more gas injector outlets 21 for supplying process gas therethrough into the interior of the vacuum chamber 40. The gas injector 20 is preferably arranged in the ceramic showerhead 30 such that a distal end of the central gas injector 20 is disposed below the plasma exposed surface 37 of the ceramic showerhead 30.

Preferably, as shown in FIG. 1, the plurality of showerhead gas outlets 32 are in fluid communication with a gas plenum 31. The gas plenum 31 is preferably supplied process gas by at least one showerhead gas supply channel 22 disposed within the central gas injector 20. In a preferred embodiment, the gas plenum 31 preferably has a diameter of at least about 10 inches and a height of about 0.06 inch. Preferably the at least one gas supply channel 22 includes one or more radially extending gas passages extending outwardly from a vertical passage thereof, wherein the one or more radially extending gas passages are configured to align with one or more respective radially extending gas passages 28 of the ceramic showerhead 30, which extend outwardly of a wall defining the central opening 35 and are in fluid communication with the plurality of showerhead gas outlets 32 and the gas plenum 31, such that process gas can be supplied to the plenum 31 of the ceramic showerhead 30 by the central gas injector 20 and thereby delivered to the interior of the vacuum chamber 40.

Alternatively, as shown in FIG. 2, the ceramic showerhead 30 can include a plurality of radially extending gas passages 33 extending inwardly from an outer periphery of the showerhead 30 wherein the radially extending gas passages are in fluid communication with the gas plenum 31 and the plurality of showerhead gas outlets 32. An exemplary embodiment of a ceramic showerhead which includes radially extending gas passages which extend inwardly from an outer periphery of the showerhead 30 can be found in commonly-assigned U.S. Pat. No. 8,562,785 which is incorporated by reference herein in its entirety.

FIG. 3A illustrates an embodiment of a ceramic showerhead 30 which can include a central gas injector in accordance with embodiments as disclosed herein. The ceramic showerhead 30 can be made of one or more pieces of alumina, silicon nitride, silicon oxide, single crystal silicon, quartz, or silicon carbide. As shown in FIG. 3, the ceramic showerhead includes a central opening 35 which is configured to receive a central gas injector. In a preferred embodiment, the ceramic showerhead 30 has a thickness of about 0.4 inch, and a diameter of at least about 20 inches. In a preferred embodiment, the ceramic showerhead 30 is a multizone ceramic showerhead having two or more zones for supplying process gas therethrough wherein the flow rate of the process gas supplied by each zone of the ceramic showerhead 30 can be independently controlled. For example, a first annular zone 33 can supply process gas at a first flow rate and a second annular zone 34 can supply process gas at a second flow rate. In an alternate embodiment, the zones can be arranged in a radial (e.g. pie shaped) configuration. Preferably, the showerhead gas outlets 32, (i.e. showerhead gas outlets 32a in the first zone 33 and showerhead gas outlets 32b in the second zone 34) have a diameter of about 0.04 inch. Preferably, each zone includes a gas plenum in fluid communication with respective showerhead gas outlets thereof. In a preferred embodiment, the ceramic showerhead 30 can include at least one blind bore 36 configured to receive a measurement device such as a temperature probe.

FIG. 3B illustrates a cross section of a central portion of the ceramic showerhead 30 having the central opening 35. Preferably the central opening 35 of the ceramic showerhead 30 has a diameter of about 1 to 1.5 inches. A vertical wall 35a defining the central opening 35 of the ceramic showerhead 30 preferably includes a circumferential groove 48 disposed therein wherein the circumferential groove 48 can have a height of about 0.15 inch and a depth of about 0.15 inch. The circumferential groove 48 can preferably be configured to form a vacuum seal with a flange of a central gas injector received in the opening 35. For example, the circumferential groove 48 can be configured to receive an O-ring.

FIG. 4 illustrates an embodiment of a central gas injector 20 which can be disposed in a ceramic showerhead in accordance with embodiments disclosed herein. The central gas injector 20 preferably includes an injector body formed of a dielectric material such as quartz and one or more gas injector outlets 21. Preferably, the central gas injector 20 is a multizone central gas injector having two or more zones for supplying process gas therethrough wherein the flow rate of the process gas supplied by each zone of the central gas injector 20 can be independently controlled. For example, zones can be formed by one or more central gas outlets 21a which preferably extend in an axial direction perpendicular to an exposed surface of the semiconductor substrate and a plurality of radial gas outlets 21b which preferably extend at about a 90° angle of the axial direction for supplying process gas to the interior of the vacuum chamber 40. Preferably, the one or more central gas outlets 21*a* are configured to receive process gas supplied by a first gas line and the radial gas outlets 21*b* are configured to receive process gas from a second gas line. Alternatively, a single gas line can supply gas to both the central gas outlets 21*a* and the radial gas outlets 21*b*. The central gas injector 20 can preferably inject process gas into a vacuum chamber 40 at a subsonic, sonic, and/or supersonic velocity.

In an alternate embodiment, the central gas injector can include one or more central gas outlets extending in an axial direction perpendicular to an exposed surface of the semiconductor substrate and a plurality of angled gas outlets extending at an acute angle to the axial direction for supplying process gas to the interior of the vacuum chamber. Preferably the one or more central gas outlets are configured to receive process gas supplied by a first gas line and the angled gas outlets are configured to receive process gas from a second gas line. In an alternate embodiment, the central gas injector 20 includes an injector body which includes at least first and second gas inlets, at least first and second gas passages, and at least first and second gas outlets, the first gas passage being in fluid communication with the first gas inlet and first gas outlet, the second gas passage being in fluid communication with the second gas inlet and second gas outlet, the first and second gas passages being discrete from each other so as to provide independently adjustable flow rates of gas through the first and second outlets. An exemplary embodiment of a gas injector including one or more central gas outlets and a plurality of angled gas outlets can be found in commonly-assigned U.S. Pat. No. 8,025,731, which is hereby incorporated herein by reference in its entirety.

In a preferred embodiment, the gas injector outlets 21 of the central gas injector 20 can include an electrically conducting shield on surfaces thereof which minimizes plasma ignition within the plurality of gas injector outlets 21 of the central gas injector 20. The central gas injector 20 preferably includes a flange 23 wherein the gas injector 20 is adapted to be slidably fitted in the central opening 35 of a ceramic showerhead 30 with an O-ring between the between the central gas injector 20 and the ceramic showerhead 30. In an alternate embodiment, the central gas injector 20 is adapted to fit in the central opening 35 of the ceramic showerhead 30 in a twist and lock arrangement. An exemplary embodiment of a twist and lock gas injector mounting arrangement can be found in commonly-assigned U.S. Patent Application No. 2013/0098554 which is incorporated by reference herein in its entirety.

Preferably a semiconductor substrate can be processed in an inductively coupled plasma processing apparatus 10 (see FIGS. 1 and 2) by placing a semiconductor substrate 5 on the substrate support 15 in the vacuum chamber 40, wherein the plasma exposed surface 37 of the ceramic showerhead 30 forming a wall of the vacuum chamber 40 faces the substrate support 15. Process gas is supplied into the vacuum chamber 40 from gas injector outlets 21 of the central gas injector 20 and/or the showerhead gas outlets 32 of the ceramic showerhead 30 wherein the flow rates of the process gas supplied by the ceramic showerhead and the central gas injector are controlled independently of each other. The process gas is energized into a plasma state by inductively coupling RF energy produced by the RF energy source 18 through the ceramic showerhead 30 into the vacuum chamber 40, the process gas being plasma phase reacted with an exposed surface of the semiconductor substrate 5 to thereby process the semiconductor substrate 5. Preferably, the ceramic showerhead 30 is a multizone ceramic showerhead including two or more zones wherein the flow rate of the process gas supplied through each of the respective zones is independently controlled. Preferably, the central gas injector 20 is a multizone central gas injector including two or more zones wherein the flow rate of the process gas supplied through each of the respective zones is independently controlled.

The flow of process gas supplied by the ceramic showerhead 30 including the central gas injector 20 to the interior of the vacuum chamber 40 is preferably switched between a diffusive gas flow and a convective gas flow, or a convective and diffusive gas flow is supplied to the interior of the vacuum chamber 40, while the pressure in the vacuum chamber 40 during processing is variably controlled so as to control redeposition of semiconductor substrate etch by-products during etching of the semiconductor substrate. Further, the ratio of gas flow through at least some of the gas injector outlets 21 and showerhead gas outlets 32 are independently varied while etching a layer on the semiconductor substrate 5 so as to achieve uniformity in center-to-edge etching of the layer. The ratio of gas flow through at least some of the gas injector outlets 21 and showerhead gas outlets 32 are independently varied such that the residence time of gas species above the upper surface of the semiconductor substrate 5 is reduced.

Figure 7:
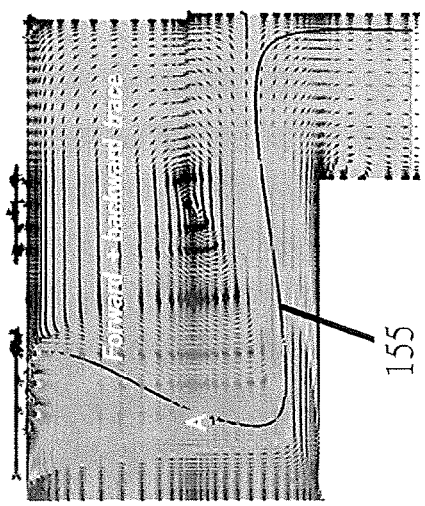
FIG. 7 illustrates an example of a gas flow pattern which can be performed by a semiconductor substrate plasma processing apparatus in accordance with embodiments as disclosed herein.
Figure 6:
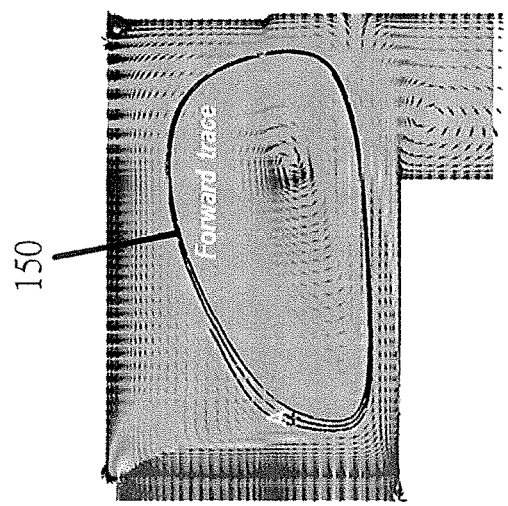
FIG. 6 illustrates an example of a gas flow pattern which can be performed by a semiconductor substrate plasma processing apparatus in accordance with embodiments as disclosed herein.
Figure 5:
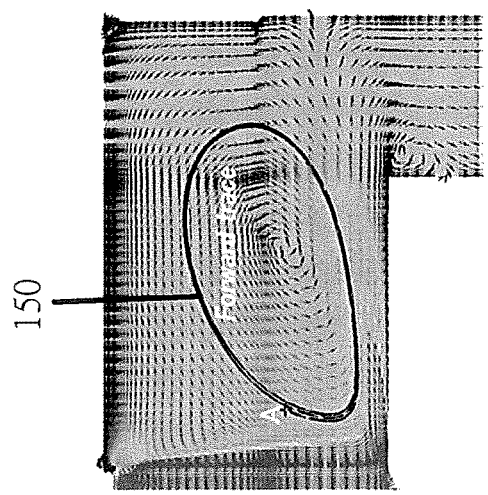
FIG. 5 illustrates an example of a gas flow pattern which can be performed by a semiconductor substrate plasma processing apparatus in accordance with embodiments as disclosed herein.

For example, FIGS. 5, 6, and 7 illustrate examples of gas flow patterns which can be performed by a semiconductor substrate plasma processing apparatus in accordance with embodiments as disclosed herein. As illustrated in FIGS. 5 and 6, which show high flow of a central gas injector 20 alone, an eddy current 150 is formed above an upper surface of a semiconductor substrate wherein etch by-product is recirculated above the upper surface of the substrate. By recirculating the etch by-product above the upper surface of the semiconductor substrate, redeposition of etch by-product on the upper surface of the semiconductor substrate is increased. However, as illustrated in FIG. 7, by supplying process gas flow with the central gas injector 20 and the ceramic showerhead 30 wherein the gas flows are independently controlled, a non-recirculated gas flow 155 can be formed such that the eddy current can be controlled. In this manner etch by-product is not recirculated above the upper surface of the semiconductor substrate, thereby reducing redeposition of etch by-product, and residence time of gas species above the upper surface of the semiconductor substrate is reduced. Thus, by controlling the recirculation of gas flow above the upper surface of the semiconductor substrate with the tunable convective-diffusive gas flow, the redeposition of etch by-products on the upper surface of the semiconductor substrate may be likewise controlled.

A control system, such as control system 385 (see FIGS. 1 and 2) preferably controls processes performed by the plasma processing apparatus, gas delivery system, and/or vacuum source. A non-transitory computer machine-readable medium can comprise program instructions for control of the plasma processing apparatus and gas delivery system. The computer program code for controlling the processing operations can be written in any conventional computer readable programming language: for example, assembly language, C, C++, Pascal, Fortran or others. Compiled object code or script is executed by the processor to perform the tasks identified in the program.

While embodiments disclosed herein have been described in detail with reference to specific embodiments thereof, it will be apparent to those skilled in the art that various changes and modifications can be made, and equivalents employed, without departing from the scope of the appended claims.

What is claimed:

1. An inductively coupled plasma processing apparatus comprising:
   a vacuum chamber;
   a vacuum source adapted to exhaust the vacuum chamber;
   a substrate support comprising a lower electrode on which a single semiconductor substrate is supported in an interior of the vacuum chamber;
   a ceramic showerhead which forms an upper wall of the vacuum chamber wherein the ceramic showerhead includes a gas plenum in fluid communication with a plurality of showerhead gas outlets in a plasma exposed surface thereof for supplying a process gas as a diffusive gas flow to the interior of the vacuum chamber, a central opening in the ceramic showerhead that extends an entire thickness of the ceramic showerhead and the ceramic showerhead including a lower vacuum sealing surface which surrounds the plasma exposed surface and forms a vacuum seal with a vacuum sealing surface of the vacuum chamber;
   a central gas injector disposed in the central opening of the ceramic showerhead, wherein the central gas injector includes one or more gas injector outlets, in a surface thereof that is exposed inside the vacuum chamber, for supplying the process gas as a convective gas flow to the interior of the vacuum chamber at least in a direction towards a center of the semiconductor substrate, wherein
      the one or more gas injector outlets include a plurality of central gas outlets, wherein the plurality of central gas outlets are arranged to supply the process gas as the convective gas flow directly from the central gas injector into the vacuum chamber without passing through the gas plenum of the ceramic showerhead, and
      the one or more gas injector outlets include a plurality of radial gas outlets arranged radially outward of the plurality of central gas outlets, wherein the plurality of radial gas outlets are arranged to supply the process gas as the diffusive gas flow radially outward from the central gas injector into the gas plenum of the ceramic showerhead and through the plurality of showerhead gas outlets;
   an RF energy source which inductively couples RF energy through the ceramic showerhead and into the vacuum chamber to energize the process gas into a plasma state to process the semiconductor substrate; and
   a control system configured to (i) control supply of the process gas as the convective gas flow through the central gas outlets via a first gas line at a first flow rate and (ii) control supply of, independently of the convective gas flow, the process gas as the diffusive gas flow through the showerhead gas outlets via a second gas line at a second flow rate, wherein the convective gas flow and the diffusive gas flow are supplied simultaneously, and wherein, to control the supply of the convective gas flow and the diffusive gas flow, the control system is further configured to select and control a pressure within the vacuum chamber, the first flow rate, and the second flow rate based on a desired eddy current above the semiconductor substrate, wherein, to achieve the desired eddy current, the control system is configured to independently control the first flow rate and the second flow rate.

2. The plasma processing apparatus of claim 1, wherein the one or more gas injector outlets include:
   an electrically conducting shield on surfaces thereof which minimizes plasma ignition within the one or more gas injector outlets of the central gas injector.

3. The plasma processing apparatus of claim 1, wherein the central gas injector at least one of:
   includes a vacuum sealing surface on an outer portion thereof wherein the vacuum sealing surface is configured to form a vacuum seal with a central vacuum sealing surface of the ceramic showerhead;
   is adapted to be slidably fitted in the central opening of the ceramic showerhead with an O-ring between the central gas injector and the ceramic showerhead;
   is adapted to fit in the central opening of the ceramic showerhead in a twist and lock arrangement;
   injects the process gas as the convective gas flow at a subsonic, sonic, supersonic velocity, or a combination thereof;
   is made of a dielectric material; and
   is arranged such that a distal end of the central gas injector is disposed below the plasma exposed surface of the ceramic showerhead.

4. The plasma processing apparatus of claim 1, wherein at least one of:
   the ceramic showerhead has a thickness of about 0.4 inch;
   the ceramic showerhead has a diameter of at least about 20 inches;
   the central opening of the ceramic showerhead has a diameter of about 1 to 1.5 inches;
   the showerhead gas outlets have a diameter of about 0.04 inch;
   the ceramic showerhead includes at least one blind bore configured to receive a temperature probe;
   a wall defining the central opening of the ceramic showerhead includes a circumferential groove disposed therein wherein the groove has a height of about 0.15 inch and a depth of about 0.15 inch;
   the gas plenum has a diameter of at least about 10 inches and a height of about 0.06 inch; and
   the ceramic showerhead is made of one or more pieces of alumina, silicon nitride, silicon oxide, single crystal silicon, quartz, or silicon carbide.

5. The plasma processing apparatus of claim 1, wherein the ceramic showerhead is a multizone ceramic showerhead having two or more zones for supplying the process gas as the diffusive gas flow therethrough, and wherein the zones are annular zones or radial zones.

6. The plasma processing apparatus of claim 1, wherein the central gas injector is a multizone central gas injector having two or more zones for supplying the process gas as the convective gas flow therethrough.

7. The plasma processing apparatus of claim 1, further comprising
   a non-transitory computer machine-readable medium comprising program instructions for control of the plasma processing apparatus.

8. The plasma processing apparatus of claim 1, wherein the central gas injector includes a showerhead gas supply channel that is connected to the gas plenum in the ceramic showerhead via the plurality of radial gas outlets.

* * * * *